(12) United States Patent
Lee (10) Patent No.: US 9,899,065 B1
(45) Date of Patent: Feb. 20, 2018

(54) POWER-ON RESET CIRCUIT AND SEMICONDUCTOR MEMORY DEVICE HAVING THE SAME

(71) Applicant: SK hynix Inc., Gyeonggi-do (KR)

(72) Inventor: Hyun Chul Lee, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/460,458

(22) Filed: Mar. 16, 2017

(30) Foreign Application Priority Data

Nov. 24, 2016 (KR) ........................ 10-2016-0157409

(51) Int. Cl.
| | |
|---|---|
| *G11C 7/10* | (2006.01) |
| *G11C 7/14* | (2006.01) |
| *H03K 17/22* | (2006.01) |
| *G11C 5/14* | (2006.01) |
| *G11C 7/22* | (2006.01) |

(52) U.S. Cl.
CPC ............... *G11C 7/14* (2013.01); *G11C 5/148* (2013.01); *G11C 7/22* (2013.01); *H03K 17/223* (2013.01)

(58) Field of Classification Search
CPC .. G11C 7/14; G11C 7/22; G11C 5/148; H03K 17/223
USPC ............................ 365/189.05, 226, 189.09
See application file for complete search history.

(56) References Cited

U.S. PATENT DOCUMENTS

| | | | | |
|---|---|---|---|---|
| 5,347,224 A * | 9/1994 | Brokaw | ................. | G01R 19/32 324/126 |
| 5,477,176 A * | 12/1995 | Chang | ................... | G11C 5/143 327/142 |
| 5,686,847 A * | 11/1997 | Stubbe | ................... | H03K 17/14 327/143 |
| 5,737,612 A * | 4/1998 | Ansel | ....................... | G06F 1/24 327/143 |
| 5,852,376 A * | 12/1998 | Kraus | .................. | H03K 17/223 327/143 |
| 5,886,549 A * | 3/1999 | Naura | .................... | H03K 17/22 327/143 |
| 5,959,477 A * | 9/1999 | Chung | ................. | H03K 17/223 327/143 |
| 6,181,628 B1 * | 1/2001 | Reynolds | ............... | G11C 5/143 365/194 |
| 6,252,442 B1 * | 6/2001 | Malherbe | ............... | H03K 17/22 327/143 |
| 6,509,768 B2 * | 1/2003 | Polizzi | ................. | H03K 17/223 327/143 |

(Continued)

FOREIGN PATENT DOCUMENTS

| | | |
|---|---|---|
| KR | 100583611 | 5/2006 |
| KR | 1020120103001 | 9/2012 |

*Primary Examiner* — Viet Q Nguyen
(74) *Attorney, Agent, or Firm* — IP & T Group LLP (57) ABSTRACT

Provided herein is a power-on reset circuit and a semiconductor memory device having the power-on reset circuit. The power-on reset circuit may include a reference voltage generation circuit configured to generate a reference voltage using an external supply voltage that is externally input, and a power-on reset signal generation circuit configured to generate a power-on reset signal by sensing a potential level of the reference voltage when the external supply voltage increases to a set level or more. The power-on reset signal generation circuit may be configured to, when the reference voltage changes depending on the temperature variation, control a sensing level to compensate for the change in the reference voltage.

16 Claims, 6 Drawing Sheets

(56) References Cited

U.S. PATENT DOCUMENTS

| | | | | |
|---|---|---|---|---|
| 6,525,515 | B1* | 2/2003 | Ngo | G05F 1/573 323/274 |
| 6,847,240 | B1* | 1/2005 | Zhou | H03K 17/145 327/143 |
| 7,504,870 | B2* | 3/2009 | McClure | H03K 17/223 327/142 |
| 7,948,284 | B2* | 5/2011 | Watanabe | G06F 1/24 327/142 |
| 8,605,536 | B2* | 12/2013 | Terzioglu | G11C 7/20 365/191 |
| 9,270,265 | B2* | 2/2016 | Nakamoto | H03K 17/223 |
| 9,407,254 | B1* | 8/2016 | De | H03K 17/223 |
| 9,632,521 | B2* | 4/2017 | Iriarte | G05F 3/242 |
| 9,712,154 | B1* | 7/2017 | Kim | H03K 17/223 |
| 2005/0258995 | A1* | 11/2005 | Arimura | H03M 1/0621 341/155 |
| 2006/0006166 | A1* | 1/2006 | Chen | G05D 23/1931 219/494 |
| 2007/0273453 | A1* | 11/2007 | Maher | H03K 3/011 331/176 |
| 2009/0315525 | A1* | 12/2009 | Nascimento | G05F 3/08 323/274 |
| 2012/0229183 | A1* | 9/2012 | Lee | H03K 17/223 327/143 |
| 2013/0120026 | A1* | 5/2013 | Zanchi | H03K 5/2445 327/77 |

* cited by examiner

POWER-ON RESET CIRCUIT AND SEMICONDUCTOR MEMORY DEVICE HAVING THE SAME

CROSS-REFERENCE TO RELATED APPLICATION

The present application claims priority under 35 U.S.C. § 119(a) to Korean patent application number 10-2016-0157409 filed on Nov. 24, 2016, the entire disclosure of which is herein incorporated by reference.

BACKGROUND

1. Technical Field

Various embodiments of the present disclosure generally relate to an electronic device, and more particularly, to a power-on reset circuit and a semiconductor memory device having the power-on reset circuit.

2. Related Art

Semiconductor memory devices are memory devices realized using a semiconductor such as silicon (Si), germanium (Ge), gallium arsenide (GaAs), indium phosphide (InP), or the like. Semiconductor memory devices are classified into volatile memory devices and nonvolatile memory devices.

The volatile memory device is a memory device in which data stored therein is lost when power is turned off. Representative examples of the volatile memory device may include a static RAM (SRAM), a dynamic RAM (DRAM), and a synchronous DRAM (SDRAM). The nonvolatile memory device is a memory device in which data stored therein is retained even when power is turned off. Representative examples of the nonvolatile memory device may include a read-only memory (ROM), a programmable ROM (PROM), an electrically programmable ROM (EPROM), an electrically erasable programmable ROM (EEPROM), a flash memory, a phase-change random access memory (PRAM), a magnetic RAM (MRAM), a resistive RAM (RRAM), and a ferroelectric RAM (FRAM). The flash memory is classified into a NOR type memory and a NAND type memory.

A semiconductor memory device is equipped with a power-on reset circuit for generating a power-on reset signal (POR). When an external supply voltage that is externally input is activated, a power-on reset signal is generated, and an internal circuit is initialized, thus preventing a semiconductor memory device from malfunctioning.

SUMMARY

Various embodiments of the present disclosure are directed to a power-on reset circuit capable of performing a stable power-on reset operation, and to a semiconductor memory device having the power-on reset circuit.

An embodiment of the present disclosure may provide for a power-on reset circuit. The power-on reset circuit may include a reference voltage generation circuit configured to generate a reference voltage based on an external supply voltage; and a power-on reset signal generation circuit configured to generate a power-on reset signal by sensing a potential level of the reference voltage when the external supply voltage increases to a set level or above, wherein when the reference voltage changes based on temperature variation, the power-on reset signal generation circuit controls a sensing level to compensate for the change in the reference voltage.

An embodiment of the present disclosure may provide for a semiconductor memory device. The semiconductor memory device may include a memory cell array including a plurality of memory cells; an internal circuit configured to perform a program operation, a read operation or an erase operation to the memory cell array, and performing an initialization operation in response to a power-on reset signal; and a power-on reset circuit configured to generate the power-on reset signal based on an external supply voltage, wherein the power-on reset circuit generates the power-on reset signal by controlling a sensing level based on temperature variation.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

Hereinafter, embodiments will be described with reference to the accompanying drawings. Embodiments are described herein with reference to cross-sectional illustrations that are schematic illustrations of embodiments and intermediate structures. As such, variations from the shapes of the illustrations as a result of, for example, manufacturing techniques and/or tolerances, are to be expected. Thus, embodiments should not be construed as limited to the particular shapes of regions illustrated herein but may include deviations in shapes that result from, for example, manufacturing. In the drawings, lengths and sizes of layers and regions may be exaggerated for clarity. Like reference numerals in the drawings denote like elements.

Terms such as "first" and "second" may be used to describe various components, but they should not limit the various components. Those terms are only used for the purpose of differentiating a component from other components. For example, a first component may be referred to as a second component, and a second component may be referred to as a first component and so forth without departing from the spirit and scope of the present disclosure. Furthermore, "and/or" may include any one of or a combination of the components mentioned.

Furthermore, a singular form may include a plural form as long as it is not specifically mentioned in a sentence. Furthermore, "include/comprise" or "including/comprising" used in the specification represents that one or more components, steps, operations, and elements exist or can be added.

Furthermore, unless defined otherwise, all the terms used in this specification including technical and scientific terms have the same meanings as would be generally understood by those skilled in the related art. The terms defined in generally used dictionaries should be construed as having the same meanings as would be construed in the context of the related art, and unless clearly defined otherwise in this specification, should not be construed as having idealistic or overly formal meanings.

It is also noted that in this specification, "connected/coupled" refers to one component not only directly coupling another component but also indirectly coupling another component through an intermediate component. Furthermore, "directly connected/directly coupled" refers to one component directly coupling another component without an intermediate component.

Figure 1:
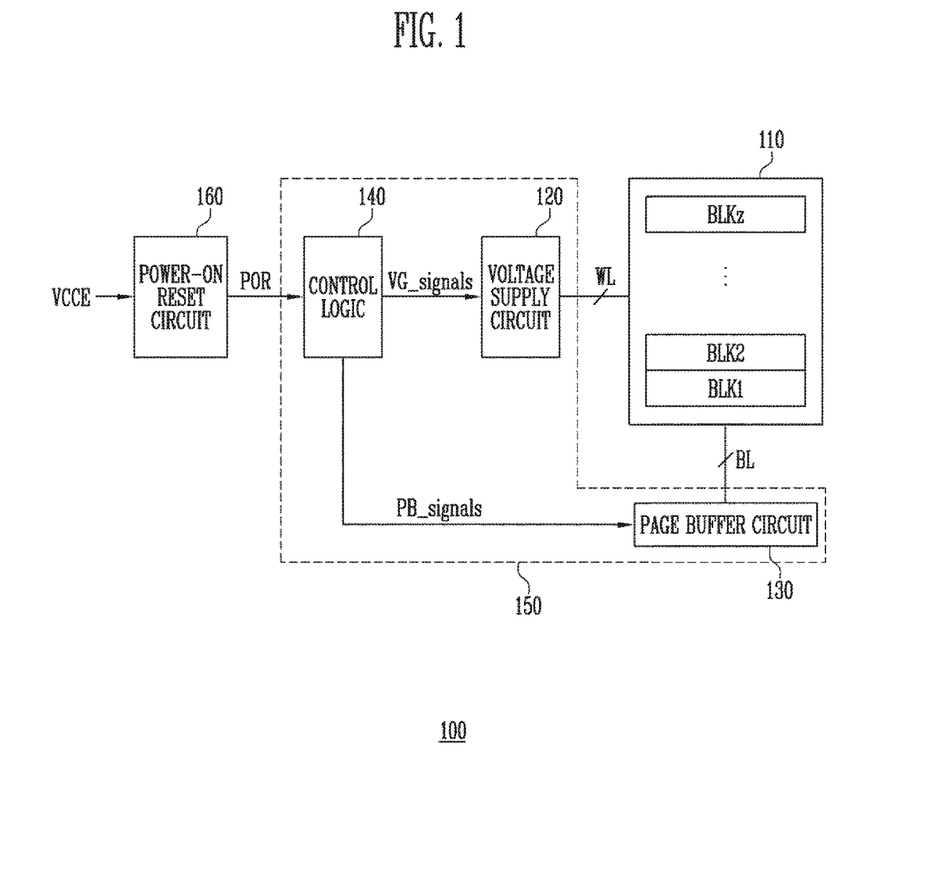
FIG. 1 is a block diagram illustrating a semiconductor memory device according to an embodiment of the present disclosure.

FIG. 1 is a block diagram illustrating a semiconductor memory device 100 according to an embodiment of the present disclosure.

Referring to FIG. 1, the semiconductor memory device 100 may include a memory cell array 110, a voltage supply circuit 120, a page buffer circuit 130, control logic 140, and a power-on reset circuit 160.

The memory cell array 110 includes a plurality of memory blocks BLK1 to BLKz. The memory blocks BLK1 to BLKz are coupled to the voltage supply circuit 120 through word lines WL. The memory blocks BLK1 to BLKz are coupled to the page buffer circuit 130 through bit lines BL. Each of the memory blocks BLK1 to BLKz may include a plurality of memory cells. In an embodiment, the plurality of memory cells may be nonvolatile memory cells. More specifically, the memory cells may be charge trap device-based nonvolatile memory cells. For the plurality of memory cells, memory cells coupled to a single word line may be defined as a single page. That is, the memory cell array 110 may be composed of a plurality of pages. Moreover, each of the memory blocks BLK1 to BLKz in the memory cell array 110 includes a plurality of memory strings. Each of the memory strings includes a drain select transistor cell, a plurality of memory cells, and a source select transistor cell, which are coupled in series between a bit line and a source line.

During a power-up period in which an external supply voltage VCCE gradually increases, the voltage supply circuit 120 may be initialized in response to control signals VG_signals output from the control logic 140. Further, during a power-on period in which the external supply voltage VCCE reaches and stays at a certain level or above, the voltage supply circuit 120 may apply an operating voltage to the word lines WL of the memory cell array 110 in response to the control signals VG_signals output from the control logic 140. Furthermore, during a power-down period in which the external supply voltage VCCE decreases below the certain level, the voltage supply circuit 120 may discharge the potential levels of the word lines WL in response to the control signals VG_signals output from the control logic 140.

The page buffer circuit 130 may be coupled to the bit lines BL of the memory cell array 110, and may be configured to control the potential levels of the bit lines BL by temporarily storing program data that is externally input during a program operation, or to output read data to the outside of the semiconductor memory device by sensing data stored in the memory cell array 110 during a read operation.

The page buffer circuit 130 may be configured to include a plurality of page buffers.

The page buffer circuit 130 may be initialized in response to control signals PB_signals output from the control logic 140 during the power-up period. Further, the page buffer circuit 130 may be controlled to perform the overall operation, such as a program operation or a read operation, in response to the control signals PB_signals output from the control logic 140 during the power-on period.

During the power-up period, the control logic 140 may be initialized in response to a power-on reset signal POR output from the power-on reset circuit 160, and may generate and output the control signals VG_signals and PB_signals for initializing the voltage supply circuit 120 and the page buffer circuit 130. Further, during the power-on period, the control logic 140 may perform the overall operation, such as a program operation, a read operation or an erase operation of the semiconductor memory device, by controlling the voltage supply circuit 120 and the page buffer circuit 130.

The voltage supply circuit 120, the page buffer circuit 130, and the control logic 140 are defined as an internal circuit 150 in the present disclosure. The internal circuit 150 may be initialized in response to the power-on reset signal POR output from the power-on reset circuit 160 during the power-up period.

The external supply voltage VCCE may be applied from the outside of the semiconductor memory device. When the external supply voltage VCCE increases to a first set level or above during the power-up period, the power-on reset circuit 160 may generate and output the power-on reset signal POR having a first logic level. Further, when the external supply voltage VCCE decreases below a second set level during the power-down period, the power-on reset circuit 160 outputs the power-on reset signal POR having a second logic level. The first logic level may be a logic low level, and the second logic level may be a logic high level. The first set level and the second set level may be identical to or different from each other.

Figure 2:
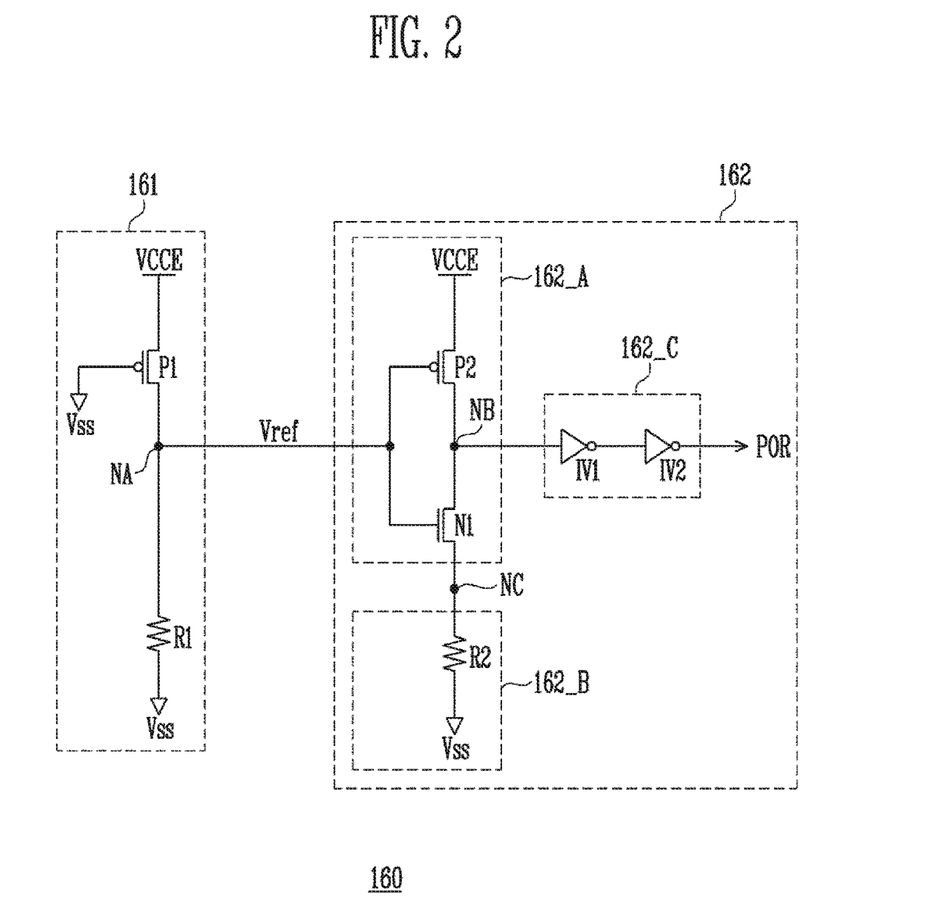
FIG. 2 is a detailed circuit diagram illustrating a power-on reset circuit according to an embodiment of the present disclosure.

FIG. 2 is a detailed circuit diagram illustrating the power-on reset circuit 160 according to an embodiment of the present disclosure.

Referring to FIG. 2, the power-on reset circuit 160 may include a reference voltage generation circuit 161 and a power-on reset (POR) signal generation circuit 162.

The reference voltage generation circuit 161 may generate and output a reference voltage Vref by dividing an external supply voltage VCCE.

The reference voltage generation circuit 161 may include a PMOS transistor P1 and a resistor R1, which are coupled in series between the external supply voltage VCCE and a ground voltage Vss. The PMOS transistor P1 is coupled between the external supply voltage VCCE and a node NA, and is configured such that the ground voltage VSS is applied to the gate of the PMOS transistor P1, thus enabling the external supply voltage VCCE to be applied to the node NA. The resistor R1 is coupled between the node NA and the ground voltage Vss. The potential level of the node NA indicates a voltage value which is divided by the ratio of the resistance values of the PMOS transistor P1 and the resistor R1, and this voltage value is output as the reference voltage Vref.

The resistance value of the resistor R1 may vary according to temperature. Therefore, the potential level of the reference voltage Vref may change depending on temperature variation. That is, when the resistance value of the resistor R1 increases according to temperature, the potential level of the reference voltage Vref also increases. When the resistance value of the resistor R1 decreases according to temperature, the potential level of the reference voltage Vref also decreases.

The POR signal generation circuit 162 may generate the power-on reset signal POR by sensing the potential level of the reference voltage Vref when the external supply voltage VCCE increases to a set level or above. That is, the POR signal generation circuit 162 generates the power-on reset signal POR based on the reference voltage Vref.

The POR signal generation circuit 162 may include a sensing circuit 162_A, a source voltage control circuit 162_B, and a buffer 162_C.

The sensing circuit 162_A may be implemented to have an inverter structure. That is, the sensing circuit 162_A may include a PMOS transistor P2 and an NMOS transistor N1, which are coupled in series between the external supply voltage VCCE and a node NC. The gates of the PMOS transistor P2 and the NMOS transistor N1 are coupled to the node NA of the reference voltage generation circuit 161. The PMOS transistor P2 and the NMOS transistor N1 are turned on or off depending on the potential level of the reference voltage Vref. For example, when the potential level of the reference voltage Vref is higher than the threshold voltage of the NMOS transistor N1, the PMOS transistor P2 is turned off and the NMOS transistor N1 is turned on. When the potential level of the reference voltage Vref is lower than the threshold voltage of the NMOS transistor N1, the NMOS transistor N1 is turned off. Therefore, the potential level of a node NB between the PMOS transistor P2 and the NMOS transistor N1 changes depending on the potential level of the reference voltage Vref.

The source voltage control circuit 162_B is coupled between the source terminal of the NMOS transistor N1 and the ground voltage Vss. The source voltage control circuit 162_B may control the source voltage value of the NMOS transistor N1 of the sensing circuit 162_A depending on temperature variation. The source voltage control circuit 162_B may include a resistor R2, the resistance value of which varies depending on the temperature variation. Since the resistance value of the resistor R2 varies according to temperature, the source voltage value of the NMOS transistor N1 may change.

The buffer 162_C may generate and output the power-on reset signal POR by buffering the potential level of the node NB.

The buffer 162_C may include an even number of inverters IV1 and IV2, which are coupled in series to the node NB. When the potential level of the node NB increases to a predetermined potential level or above, the buffer 162_C may output the power-on reset signal POR having a logic high level by buffering the increased potential level, whereas when the potential level of the node NB decreases below the predetermined potential level, the buffer 162_C may output a power-on reset signal POR having a logic low level.

The operation of the above-described POR signal generation circuit 162 will be described in detail below.

When the external supply voltage VCCE increases during the power-up period, the reference voltage generation circuit 161 may output the reference voltage Vref through the node NA by dividing the external supply voltage VCCE. Furthermore, the reference voltage Vref increases in proportion to the external supply voltage VCCE.

When the external supply voltage VCCE continuously increases up to a set level or above, the NMOS transistor N1 of the sensing circuit 162_A is turned on in response to the reference voltage Vref, which is generated by dividing the external supply voltage VCCE, so that the potential level of the node NB is discharged to the ground voltage Vss through the NMOS transistor N1 and the source voltage control circuit 162_B, and then becomes a low level.

The buffer 162_C generates and outputs the power-on reset signal POR having a logic low level by buffering the potential level of the node NB.

The external supply voltage VCCE is supplied at a certain level equal to or greater than the set level, and then the potential level of the external supply voltage VCCE decreases during the power-down period. Due thereto, the potential level of the node NA, that is, the potential level of the reference voltage Vref, may decrease. When the external supply voltage VCCE gradually decreases, the potential level of the reference voltage Vref also decreases. When the external supply voltage VCCE decreases below the set level, the NMOS transistor N1 of the sensing circuit 162_A is turned off according to the reference voltage Vref. Therefore, the potential level of the node NB increases. Due thereto, the node NB Is electrically isolated from the ground voltage Vss, and the potential level of the node NB Is increased by the external supply voltage VCCE. Accordingly, the buffer 162_C may generate and output the power-on reset signal POR having a logic high level by buffering the potential level of the node NB. As the external supply voltage VCCE continuously decreases, the potential level of the power-on reset signal POR also continuously decreases.

The resistance value of the resistor R1 Included in the reference voltage generation circuit 161 may vary according to temperature. Accordingly, when temperature varies, the potential level of the reference voltage Vref may also change. As a result, the source voltage control circuit 162_B may control the sensing level of the sensing circuit 162_A by controlling the source voltage value of the NMOS transistor N1 of the sensing circuit 162_A depending on temperature variation. That is, even if the reference voltage Vref changes depending on the temperature variation, a stable sensing operation may be performed by compensating for the change in the reference voltage.

Figure 3:
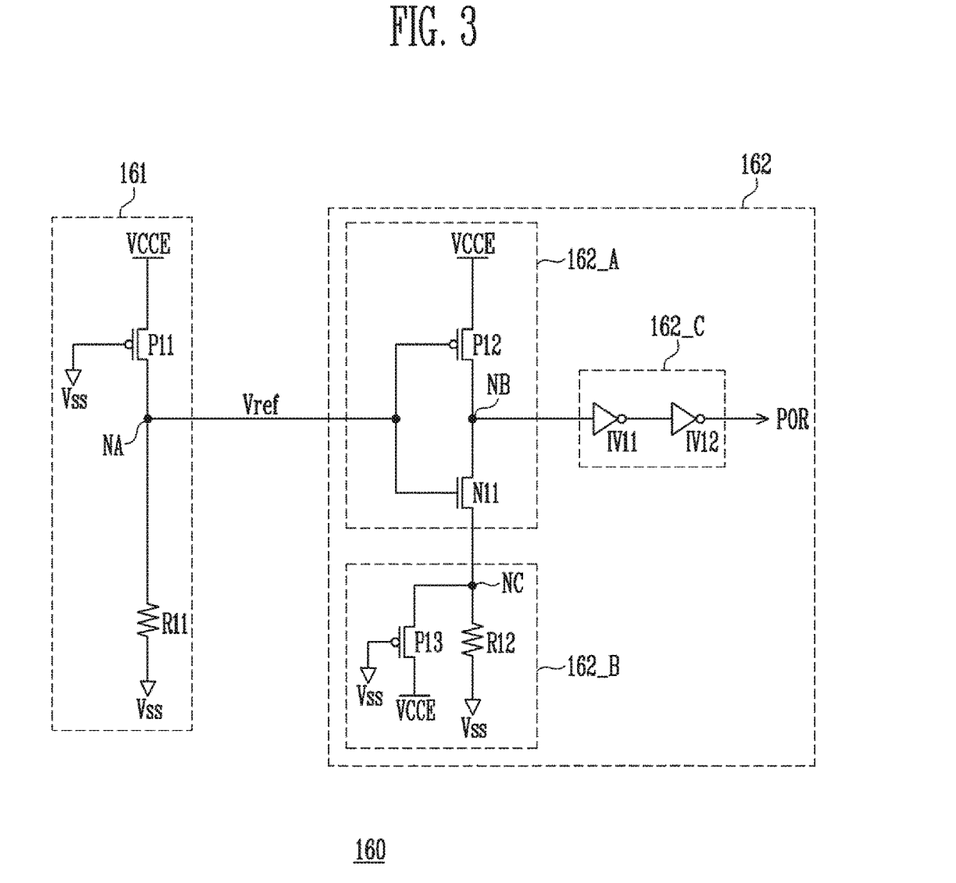
FIG. 3 is a detailed circuit diagram illustrating a power-on reset circuit according to an embodiment of the present disclosure.

FIG. 3 is a detailed circuit diagram illustrating the power-on reset circuit 160 according to an embodiment of the present disclosure.

Referring to FIG. 3, the power-on reset circuit 160 may include a reference voltage generation circuit 161 and a POR signal generation circuit 162.

The reference voltage generation circuit 161 may generate and output a reference voltage Vref by dividing an external supply voltage VCCE.

The reference voltage generation circuit 161 may be the same as the reference voltage generation circuit 161 described with reference to FIG. 2.

The POR signal generation circuit 162 may generate the power-on reset signal POR by sensing the potential level of the reference voltage Vref when the external supply voltage VCCE increases to a set level or above. That is, the POR signal generation circuit 162 generates the power-on reset signal POR based on the reference voltage Vref.

The POR signal generation circuit 162 may include a sensing circuit 162_A, a source voltage control circuit 162_B, and a buffer 162_C.

The sensing circuit 162_A and the buffer 162_C may be the same as the sensing circuit 162_A and the buffer 162_C described with reference to FIG. 2, respectively.

Referring to FIG. 3, the source voltage control circuit 162_B is coupled between the source terminal of the NMOS transistor N11 and the ground voltage Vss. The source voltage control circuit 162_B may control the source voltage value of the NMOS transistor N11 of the sensing circuit 162_A depending on temperature variation.

The source voltage control circuit 162_B may include a resistor R12, the resistance value of which varies depending on the temperature variation, and a PMOS transistor P13 which transfers the external supply voltage VCCE to the node NC. The ground voltage Vss is applied to the gate of the PMOS transistor P13, and thus the external supply voltage VCCE is applied to the node NC. As temperature rises, the resistance value of the resistor R12 increases, and thus the source voltage value of the NMOS transistor N11, that is, the potential level of the node NC, may change according to temperature.

The operation of the above-described POR signal generation circuit 162 may be the same as described with reference to FIG. 2.

The resistance value of the resistor R11 included in the reference voltage generation circuit 161 may vary according to temperature. Accordingly, when temperature varies, the potential level of the reference voltage Vref may also change. As a result, the source voltage control circuit 162_B may control the sensing level of the sensing circuit 162_A by controlling the source voltage value of the NMOS transistor N11 of the sensing circuit 162_A depending on the temperature variation. That is, even if the reference voltage Vref changes depending on the temperature variation, a stable sensing operation may be performed by compensating for the change in the reference voltage.

Figure 4:
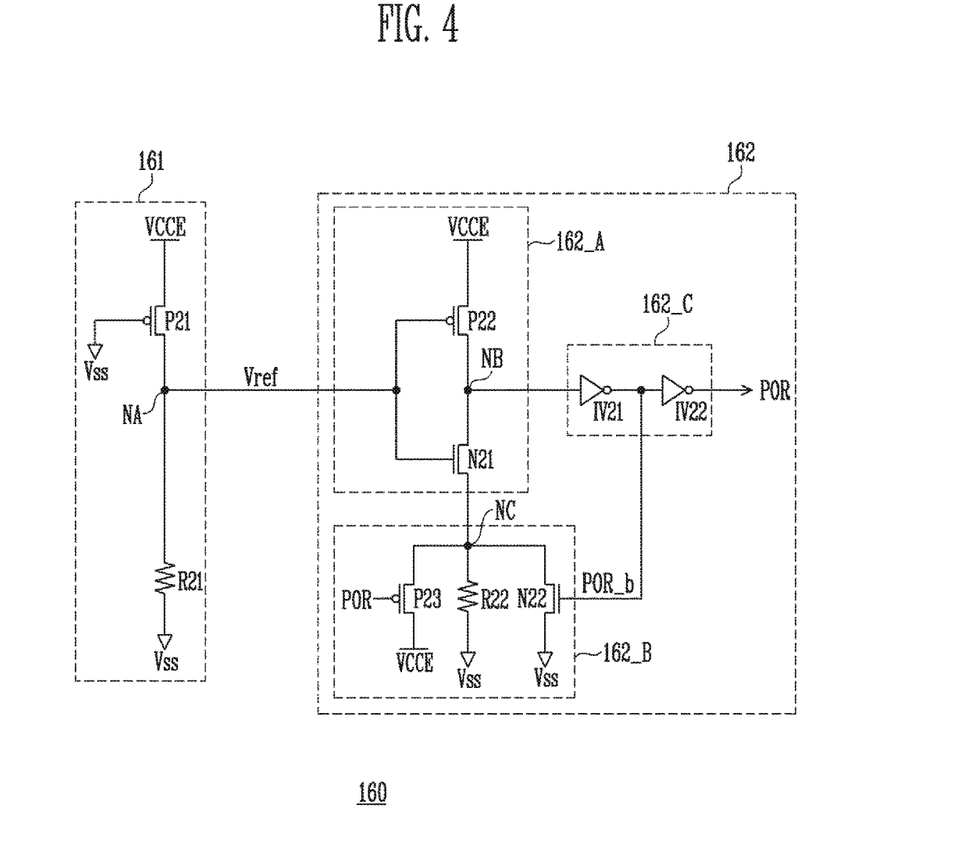
FIG. 4 is a detailed circuit diagram illustrating a power-on reset circuit according to an embodiment of the present disclosure.

FIG. 4 is a detailed circuit diagram Illustrating the power-on reset circuit 160 according to an embodiment of the present disclosure.

Referring to FIG. 4, the power-on reset circuit 160 may include a reference voltage generation circuit 161 and a POR signal generation circuit 162.

The reference voltage generation circuit 161 may generate and output a reference voltage Vref by dividing an external supply voltage VCCE.

The reference voltage generation circuit 161 may be the same as the reference voltage generation circuit 161 described with reference to FIG. 2.

The POR signal generation circuit 162 may generate the power-on reset signal POR by sensing the potential level of the reference voltage Vref when the external supply voltage VCCE increases to a set level or above. That is, the POR signal generation circuit 162 generates the power-on reset signal POR based on the reference voltage Vref.

The POR signal generation circuit 162 may include a sensing circuit 162_A, a source voltage control circuit 162_B, and a buffer 162_C.

The sensing circuit 162_A and the buffer 162_C may be the same as the sensing circuit 162_A and the buffer 162_C described with reference to FIG. 2, respectively.

Referring to FIG. 4, the source voltage control circuit 162_B is coupled between the source terminal of the NMOS transistor N21 and the ground voltage Vss. The source voltage control circuit 162_B may control the source voltage value of the NMOS transistor N21 of the sensing circuit 162_A depending on temperature variation.

The source voltage control circuit 162_B may include a resistor R22, the resistance value of which varies depending on the temperature variation, a PMOS transistor P23 which transfers the external supply voltage VCCE to the node NC, and an NMOS transistor N22 which transfers the ground voltage Vss to the node NC. The power-on reset signal POR is applied to the gate of the PMOS transistor P23, and the external supply voltage VCCE is applied to the node NC when the power-on reset signal POR has a logic low level. An inverted signal POR_b of the power-on reset signal POR is applied to the gate of the NMOS transistor N22, and thus the voltage of the node NC is controlled. As temperature rises, the resistance value of the resistor R22 also increases, and thus the source voltage value of the NMOS transistor N21, that is, the potential level of the node NC, may change according to temperature.

The operation of the above-described POR signal generation circuit 162 may be the same as described with reference to FIG. 2.

The resistance value of the resistor R21 included in the reference voltage generation circuit 161 may vary according to temperature. Accordingly, when temperature varies, the potential level of the reference voltage Vref may also change. As a result, the source voltage control circuit 162_B may control the sensing level of the sensing circuit 162_A by controlling the source voltage value of the NMOS transistor N21 of the sensing circuit 162_A depending on the temperature variation. That is, even if the reference voltage Vref changes depending on the temperature variation, a stable sensing operation may be performed by compensating for the change in the reference voltage.

Figure 5:
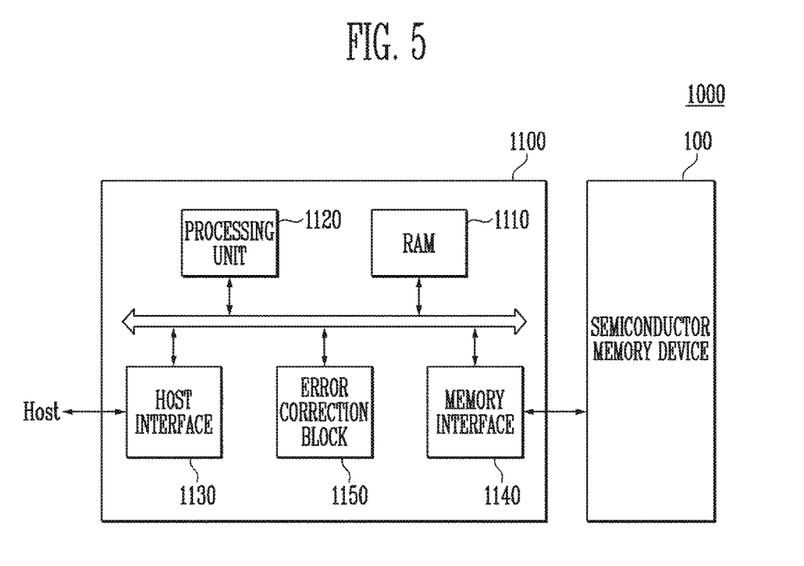
FIG. 5 is a diagram illustrating a memory system including the semiconductor memory device of FIG. 1.

FIG. 5 is a diagram illustrating a memory system including the semiconductor memory device of FIG. 1.

Referring to FIG. 5, a memory system 1000 may include a semiconductor memory device 100 and a controller 1100.

The semiconductor memory device 100 may have the same configuration and operation as that described above with reference to FIG. 1, and thus any repetitive detailed description will be omitted.

The controller 1100 may be coupled to a host Host and the semiconductor memory device 100. The controller 1100 may access the semiconductor memory device 100 in response to a request from the host Host. For example, the controller 1100 may control read, write, erase, and background operations of the semiconductor memory device 100. The controller 1100 may provide an interface between the host Host and the semiconductor memory device 100. The controller 1100 is configured to run firmware for controlling the semiconductor memory device 100.

The controller 1100 includes a random access memory (RAM) 1110, a processing unit 1120, a host interface 1130, a memory interface 1140, and an error correction block 1150. The RAM 1110 is used as at least one of an operation memory of the processing unit 1120, a cache memory between the semiconductor memory device 100 and the host Host, and a buffer memory between the semiconductor memory device 100 and the host Host. The processing unit 1120 controls the overall operation of the controller 1100. In addition, the controller 1100 may temporarily store program data provided from the host Host during the write operation.

The host interface 1130 may include a protocol for performing data exchange between the host Host and the controller 1100. In an embodiment, the controller 1100 may communicate with the host Host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, and an integrated drive electronics (IDE) protocol, a private protocol, and the like.

The memory interface 1140 interfaces with the semiconductor memory device 100. For example, the memory interface includes a NAND interface or a NOR interface.

The error correction block 1150 uses an error correcting code (ECC) to detect and correct an error in data received from the semiconductor memory device 100. The processing unit 1120 may adjust the read voltage according to an error detection result from the error correction block 1150, and control the semiconductor memory device 100 to perform re-reading. In an example of an embodiment, the error correction block may be provided as an element of the controller 1100.

The controller 1100 and the semiconductor memory device 100 may be integrated into a single semiconductor device. In an example of an embodiment, the controller 1100 and the semiconductor memory device 100 may be integrated into a single semiconductor device to form a memory card. For example, the controller 1100 and the semiconductor memory device 100 may be integrated into a single semiconductor device and form a memory card such as a personal computer memory card international association (PCMCIA), a compact flash card (CF), a smart media card (SM or SMC), a memory stick multimedia card (MMC, RS-MMC, or MMCmicro), a SD card (SD, miniSD, microSD, or SDHC), a universal flash storage (UFS), and the like.

The controller 1100 and the semiconductor memory device 100 may be integrated into a single semiconductor device to form a solid state drive (SSD). The SSD includes a storage device formed to store data in a semiconductor memory. When the memory system 1000 is used as the SSD, an operation speed of the host Host coupled to the memory system 1000 may be phenomenally improved.

In an embodiment, the memory system 1000 may be provided as one of various elements of an electronic device such as a computer, a ultra mobile PC (UMPC), a workstation, a net-book, a personal digital assistants (PDA), a portable computer, a web tablet, a wireless phone, a mobile phone, a smart phone, an e-book, a portable multimedia player (PMP), a game console, a navigation device, a black box, a digital camera, a 3-dimensional television, a digital audio recorder, a digital audio player, a digital picture recorder, a digital picture player, a digital video recorder, a digital video player, a device capable of transmitting/receiving information in an wireless environment, one of various devices for forming a home network, one of various electronic devices for forming a computer network, one of various electronic devices for forming a telematics network, an RFID device, one of various elements for forming a computing system, or the like.

In an embodiment, the semiconductor memory device 100 or the memory system 1000 may be embedded in various types of packages. For example, the semiconductor memory device 100 or the memory system 1000 may be packaged in a type such as Package on Package (PoP), Ball grid arrays (BGAs), Chip scale packages (CSPs), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), or the like.

Figure 6:
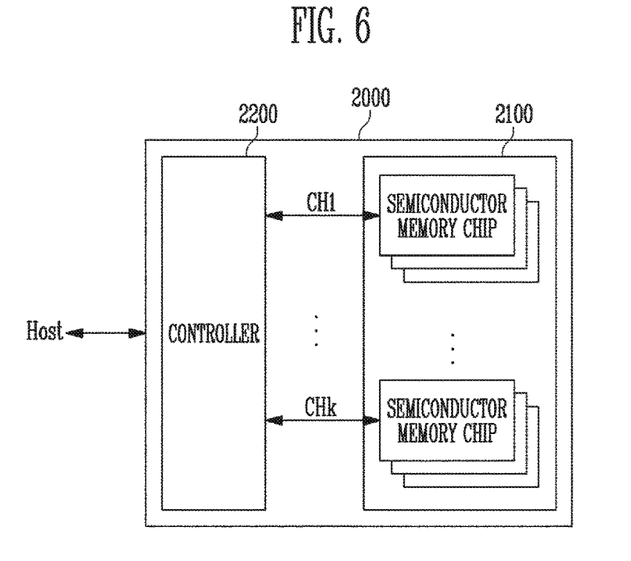
FIG. 6 is a diagram illustrating an example of the memory system of FIG. 5.

FIG. 6 is a diagram illustrating an embodiment of the memory system of FIG. 5.

Referring to FIG. 6, a memory system 2000 may include a semiconductor memory device 2100 and a controller 2200. The semiconductor memory device 2100 includes a plurality of memory chips. The semiconductor memory chips are divided into a plurality of groups.

Referring to FIG. 6, it is illustrated that each of the plurality of groups communicates with the controller 2200 through first to k-th channels CH1 to CHk. Each semiconductor memory chip may have the same configuration and operation as the semiconductor memory device 100 described with reference to FIG. 1.

Each group communicates with the controller 2200 through one common channel. The controller 2200 has the same configuration as the controller 1100 described with reference to FIG. 5 and is configured to control a plurality of memory chips of the semiconductor memory device 2100 through the plurality of channels CH1 to CHk.

Figure 7:
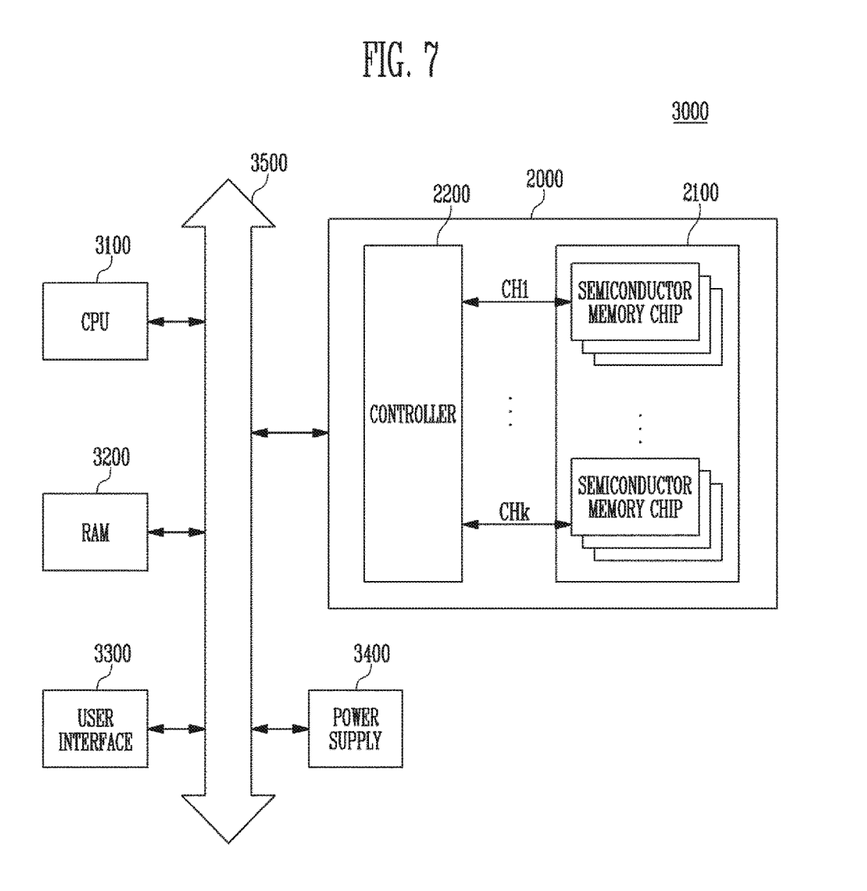
FIG. 7 is a diagram illustrating a computing system including the memory system described with reference to FIG. 6.

FIG. 7 is a diagram illustrating a computing system including the memory system described with reference to FIG. 6.

Referring to FIG. 7, the computing system 3000 may include a central processing unit (CPU) 3100, a RAM 3200, a user interface 3300, a power supply 3400, a system bus 3500, and a memory system 2000.

The memory system 2000 is electrically coupled to the CPU 3100, the RAM 3200, the user interface 3300, and the power supply 3400 through the system bus 3500. Data provided through the user interface 3300 or processed by the CPU 3100 is stored in the memory system 2000.

Referring to FIG. 7, the semiconductor memory device 2100 is Illustrated as being coupled to the system bus 3500 through the controller 2200. However, the semiconductor memory device 2100 may be directly coupled to the system bus 3500. The function of the controller 2200 may be performed by the CPU 3100 and the RAM 3200.

Referring to FIG. 7, it is illustrated that the memory system 2000 described with reference to FIG. 6 is provided. However, the memory system 2000 may be replaced with the memory system 1000 described with reference to FIG. 5. In an embodiment, the computing system 3000 may Include all of the memory systems 1000 and 2000 described with reference to FIGS. 5 and 6.

According to the present disclosure, even if the reference voltage of the power-on reset circuit changes according to temperature, the change in the reference voltage may be compensated for, thus enabling a stable power-on reset operation to be performed.

Examples of embodiments have been disclosed herein, and although specific terms are employed, the terms are used and are to be Interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A power-on reset circuit, comprising:
 a reference voltage generation circuit configured to generate a reference voltage based on an external supply voltage; and a power-on reset signal generation circuit configured to generate a power-on reset signal by sensing a potential level of the reference voltage when the external supply voltage increases to a set level or above, wherein when the reference voltage changes based on temperature variation, the power-on reset signal generation circuit controls a sensing level to compensate for the change in the reference voltage, wherein the power-on reset signal generation circuit includes a sensing circuit configured to control a potential level of an internal node by sensing the potential level of the reference voltage, wherein the sensing circuit includes a PMOS transistor and an NMOS transistor, which are coupled in series at the internal node between the external supply voltage and a sensing reference node of a sensing reference voltage of the sensing circuit, and wherein the PMOS transistor and the NMOS transistor are configured to control the potential level of the internal node based on the reference voltage.

2. The power-on reset circuit according to claim 1, wherein the reference voltage generation circuit changes the reference voltage based on the temperature variation.

3. The power-on reset circuit according to claim 2, wherein the reference voltage generation circuit includes a resistor dividing the external supply voltage, and wherein the resistor has a resistance value that varies based on the temperature variation.

4. The power-on reset circuit according to claim 1, wherein the power-on reset signal generation circuit further includes:

a buffer configured to generate the power-on reset signal by buffering the potential level of the internal node; and a sensing reference voltage control circuit configured to control a sensing level of the sensing circuit by controlling the sensing reference voltage based on the temperature variation.

5. The power-on reset circuit according to claim 4, wherein the sensing reference voltage control circuit includes a resistor part coupled between the sensing reference node and a ground voltage, wherein the resistor part has a resistance value varying based on the temperature variation thereby controlling the sensing reference voltage based on the temperature variation.

6. The power-on reset circuit according to claim 4, wherein the sensing reference voltage control circuit includes:

a resistor part coupled between the sensing reference node and a ground voltage;

a first switch coupled between the external supply voltage and the sensing reference node; and a second switch coupled between the ground voltage and the sensing reference node.

7. The power-on reset circuit according to claim 6, wherein the resistor part has a resistance value varying based on the temperature variation thereby controlling the sensing reference voltage based on the temperature variation.

8. The power-on reset circuit according to claim 6, wherein the first switch controls a potential level of the sensing reference node by applying the external supply voltage to the sensing reference node in response to the power-on reset signal, and wherein the second switch controls the potential level of the sensing reference node by applying the ground voltage to the sensing reference node in response to an inverted signal of the power-on reset signal.

9. A semiconductor memory device, comprising:

a memory cell array including a plurality of memory cells;

an internal circuit configured to perform a program operation, a read operation or an erase operation to the memory cell array, and performing an initialization operation in response to a power-on reset signal; and a power-on reset circuit configured to generate the power-on reset signal based on an external supply voltage, wherein the power-on reset circuit generates the power-on reset signal by controlling a sensing level based on temperature variation, wherein the power-on reset circuit comprises:

a reference voltage generation circuit configured to generate a reference voltage based on the external supply voltage, and a power-on reset signal generation circuit configured to generate the power-on reset signal by sensing a potential level of the reference voltage when the external supply voltage increases to a set level or above, wherein when the reference voltage changes based on the temperature variation, the power-on reset signal generation circuit controls a sensing level to compensate for the change in the reference voltage, wherein the power-on reset signal generation circuit includes a sensing circuit configured to control a potential level of an internal node by sensing the potential level of the reference voltage, wherein the sensing circuit includes a PMOS transistor and an NMOS transistor, which are coupled in series at the internal node between the external supply voltage and a sensing reference node of a sensing reference voltage of the sensing circuit, and wherein the PMOS transistor and the NMOS transistor are configured to control the potential level of the internal node based on the reference voltage.

10. The semiconductor memory device according to claim 9, wherein the reference voltage generation circuit changes the reference voltage based on the temperature variation.

11. The semiconductor memory device according to claim 10, wherein the reference voltage generation circuit includes a resistor dividing the external supply voltage, and wherein the resistor has a resistance value that varies based on the temperature variation.

12. The semiconductor memory device according to claim 9, wherein the power-on reset signal generation circuit further includes:

a buffer configured to generate the power-on reset signal by buffering the potential level of the internal node; and a sensing reference voltage control circuit configured to control a sensing level of the sensing circuit by controlling the sensing reference voltage based on the temperature variation.

13. The semiconductor memory device according to claim 12, wherein the sensing reference voltage control circuit includes a resistor part coupled between the sensing reference node and a ground voltage, wherein the resistor part has a resistance value varying based on the temperature variation thereby controlling the sensing reference voltage based on the temperature variation.

14. The semiconductor memory device according to claim 12, wherein the sensing reference voltage control circuit includes:

a resistor part coupled between the sensing reference node and a ground voltage;

a first switch coupled between the external supply voltage and the sensing reference node; and a second switch coupled between the ground voltage and the sensing reference node.

15. The semiconductor memory device according to claim 14, wherein the resistor part has a resistance value varying based on the temperature variation thereby controlling the sensing reference voltage based on the temperature variation.

16. The semiconductor memory device according to claim 14, wherein the first switch controls a potential level of the sensing reference node by applying the external supply voltage to the sensing reference node in response to the power-on reset signal, and wherein the second switch controls the potential level of the sensing reference node by applying the ground voltage to the sensing reference node in response to an inverted signal of the power-on reset signal.

* * * * *